(12) United States Patent
Chen et al.

(10) Patent No.: US 10,644,160 B2
(45) Date of Patent: May 5, 2020

(54) THIN FILM TRANSISTOR AND FABRICATING METHOD THEREOF, ARRAY SUBSTRATE AND DISPLAY DEVICE

(71) Applicant: BOE TECHNOLOGY GROUP CO., LTD., Beijing (CN)

(72) Inventors: Jiangbo Chen, Beijing (CN); Young Suk Song, Beijing (CN); Hongda Sun, Beijing (CN); Guoying Wang, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 16/077,846

(22) PCT Filed: Jan. 29, 2018

(86) PCT No.: PCT/CN2018/074438
§ 371 (c)(1),
(2) Date: Aug. 14, 2018

(87) PCT Pub. No.: WO2018/205692
PCT Pub. Date: Nov. 15, 2018

(65) Prior Publication Data
US 2020/0035834 A1    Jan. 30, 2020

(30) Foreign Application Priority Data

May 11, 2017 (CN) .......................... 2017 1 0330483

(51) Int. Cl.
*H01L 27/146* (2006.01)
*H01L 29/786* (2006.01)
(Continued)

(52) U.S. Cl.
CPC ........ *H01L 29/78606* (2013.01); *H01L 21/44* (2013.01); *H01L 27/124* (2013.01);
(Continued)

(58) Field of Classification Search
CPC ...................................................... H01L 29/68
See application file for complete search history.

(56) References Cited

U.S. PATENT DOCUMENTS

2011/0286256 A1* 11/2011 Kamata ................. G11C 11/404
365/72
2013/0112972 A1    5/2013 Koike et al.
(Continued)

FOREIGN PATENT DOCUMENTS

CN    102971857 A    3/2013
CN    104183647 A    12/2014
(Continued)

OTHER PUBLICATIONS

International Search Report from PCT Application No. PCT/CN2018/074438 dated May 4, 2018 (5 pages).
(Continued)

*Primary Examiner* — Cheung Lee
(74) *Attorney, Agent, or Firm* — Dave Law Group LLC; Raj S. Dave

(57) ABSTRACT

The present disclosure relates to a thin film transistor, a method for fabricating the same, an array substrate, a method for fabricating the same, and a display device. The thin film transistor includes an active layer disposed on a base substrate and a gate stack disposed on the active layer. The gate stack includes: a gate insulating layer disposed on the active layer; a gate electrode disposed on the gate insulating layer; a capping layer disposed on the gate electrode, wherein the capping layer capturing oxygen atoms more easily than the gate electrode.

17 Claims, 10 Drawing Sheets

(51) Int. Cl.
*H01L 21/44* (2006.01)
*H01L 27/12* (2006.01)
*H01L 29/66* (2006.01)

(52) U.S. Cl.
CPC .... *H01L 27/1225* (2013.01); *H01L 27/14603* (2013.01); *H01L 29/66969* (2013.01); *H01L 29/7869* (2013.01); *H01L 29/78633* (2013.01)

(56) References Cited

U.S. PATENT DOCUMENTS

| | | | |
|---|---|---|---|
| 2013/0187152 A1* | 7/2013 | Yamazaki | ......... H01L 29/78693 257/43 |
| 2013/0293524 A1 | 11/2013 | Park et al. | |
| 2014/0346499 A1 | 11/2014 | Kato | |
| 2018/0019263 A1 | 1/2018 | Kong et al. | |

FOREIGN PATENT DOCUMENTS

| | | |
|---|---|---|
| CN | 104393000 A | 3/2015 |
| CN | 104992950 A | 10/2015 |
| CN | 106935659 A | 7/2017 |
| EP | 1054075 A1 | 11/2000 |
| JP | 2013115182 A | 6/2013 |

OTHER PUBLICATIONS

Written Opinion from PCT Application No. PCT/CN2018/074438 dated May 4, 2018 (4 pages).

* cited by examiner

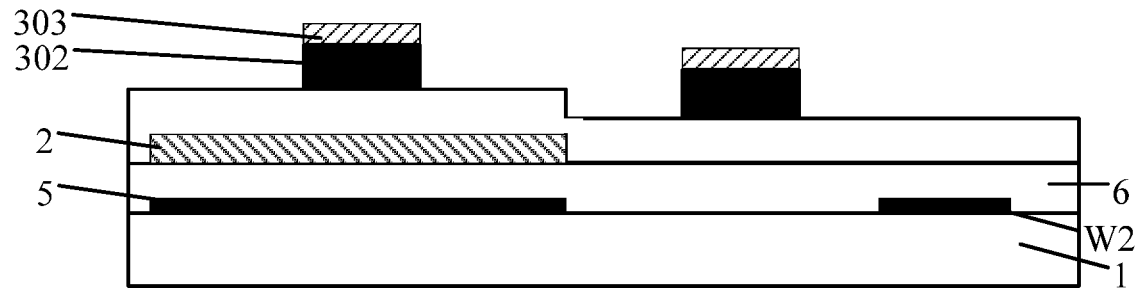
FIG. 11 ( E )
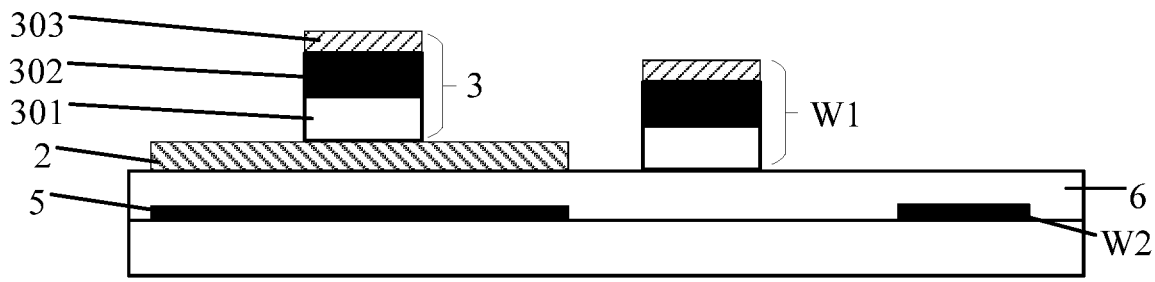
FIG. 11 ( F )
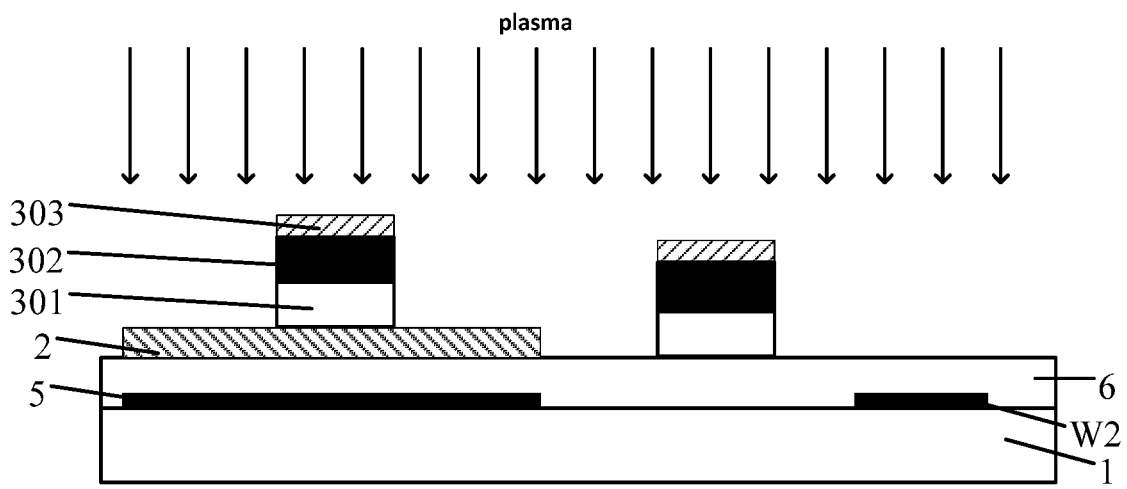
FIG. 11 ( G )

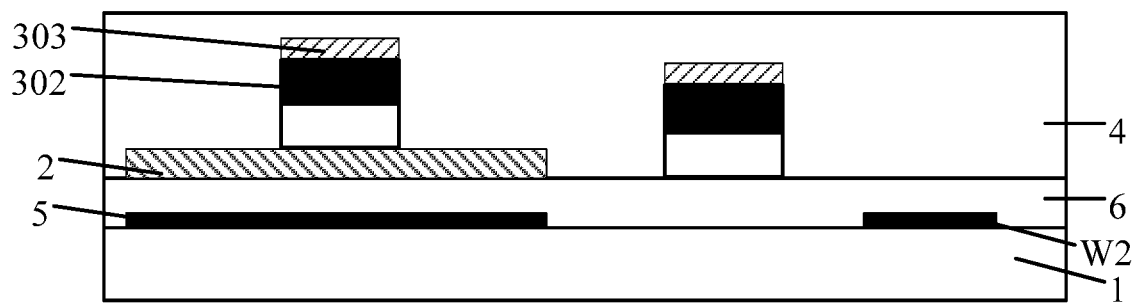
FIG. 11 ( H )
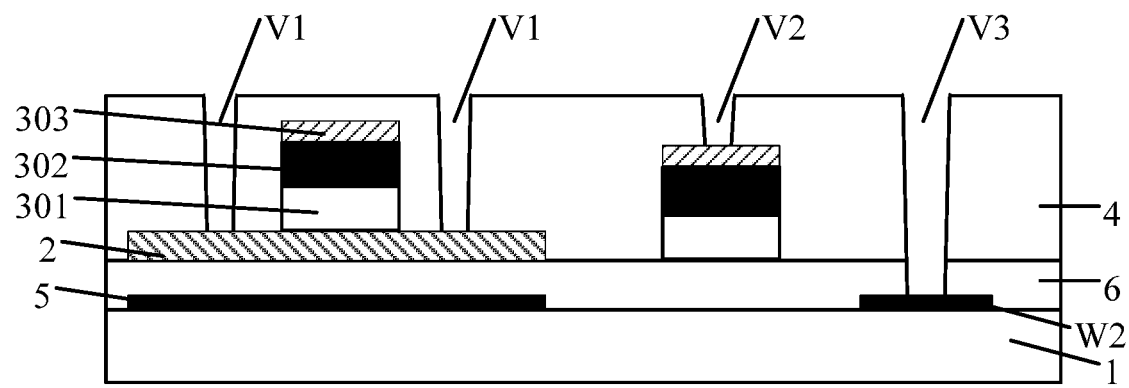
FIG. 11 ( I )

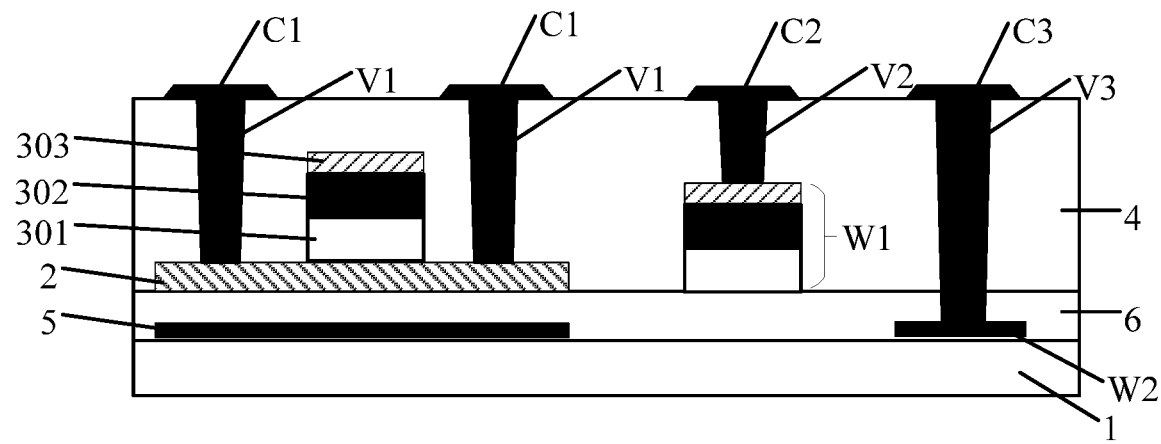
FIG. 11 ( J )
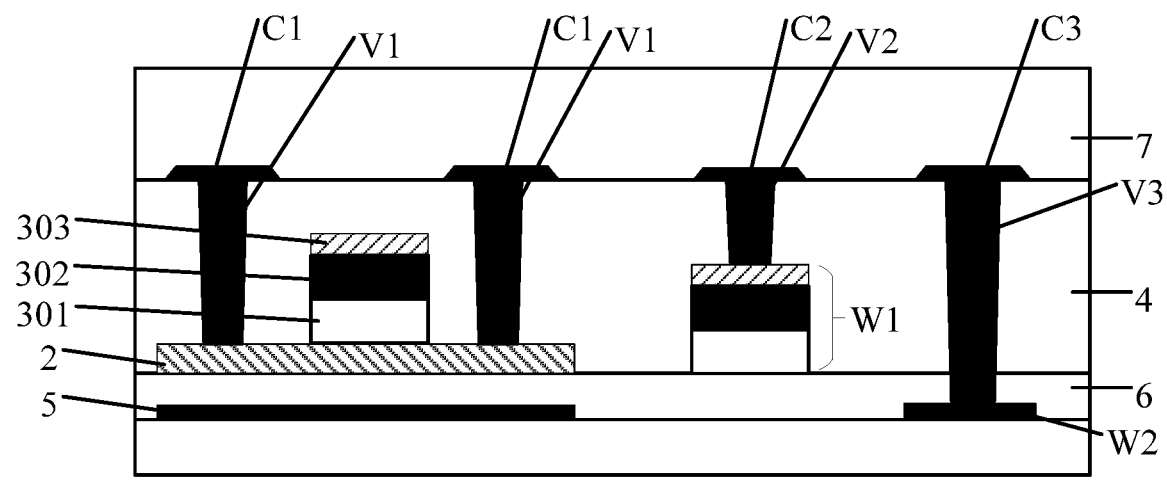
FIG. 11 ( K )

THIN FILM TRANSISTOR AND FABRICATING METHOD THEREOF, ARRAY SUBSTRATE AND DISPLAY DEVICE

CROSS-REFERENCE TO RELATED APPLICATIONS

This application claims priority from Chinese Patent Application No. 201710330483.5 filed on May 11, 2017, the entire contents of which are hereby incorporated by reference.

FIELD

The present disclosure relates to a field of display technology. More specifically, it relates to a thin film transistor, a method for fabricating the same, an array substrate, and a display device.

BACKGROUND

A thin film transistor is an important component of the driving circuit and is widely used in display devices. Oxide transistor technology as a hot spot at the present stage has the characteristics of high mobility, good uniformity and so on, and has received widespread attention. However, in the prior art, there are still some technical difficulties that need to be solved for thin film transistors.

SUMMARY

Embodiments of the present disclosure provide a thin film transistor, a method for fabricating the same, an array substrate, and a display device.

The first aspect of the present disclosure provides a thin film transistor. The thin film transistor includes: an active layer disposed on a base substrate and a gate stack disposed on the active layer. The gate stack comprises: a gate insulating layer disposed on the active layer; a gate electrode disposed on the gate insulating layer; a capping layer disposed on the gate electrode and being more easily to trap oxygen atoms than the gate electrode.

In one embodiment, the capping layer includes a gallium-containing oxide.

In one embodiment, the niobium-containing oxide includes at least one of the following materials: IGZO, GZO, IGO, gallium oxide, or a combination thereof.

In one embodiment, the gallium-containing oxide is oxygen deficient.

In one embodiment, a material of the capping layer and a material of the active layer are the same.

In one embodiment, the thin film transistor further includes a dielectric layer disposed on the capping layer, wherein the dielectric layer covers an upper surface of the active layer.

In one embodiment, the thin film transistor further includes a first contact portion disposed on the dielectric layer and a first hole in the dielectric layer, wherein the first contact portion is connected to the source/drain region of the thin film transistor via the first hole.

A second aspect of the present disclosure provides an array substrate. The array substrate includes a thin film transistor as described above.

In one embodiment, the array substrate further includes a first wiring in the dielectric layer, the first wiring having the same structure as the gate stack, a top surface of the first wiring being higher than a top surface of the active layer; a second contact portion on the dielectric layer; a second hole in the dielectric layer, wherein the second contact portion is connected to the first wiring via the second hole.

In one embodiment, the array substrate further includes a light shielding layer disposed between the active layer and the base substrate to block light from below the active layer from entering the active layer; a second wiring being in the same layer as the light shielding layer; a third contact portion on the dielectric layer; a third hole passing through the dielectric layer and extending into the base substrate, wherein the third contact portion is connected to the second wiring through the third through hole.

In one embodiment, the array substrate further includes a buffer layer disposed between the active layer and the base substrate, wherein the buffer layer covers an upper surface of the light shielding layer, an upper surface of the second wiring and an upper surface of the base substrate; a passivation layer on the first contact portion, the second contact portion and the third contact portion.

A third aspect of the present disclosure provides a display device. The display device includes the array substrate as described above.

A fourth aspect of the present disclosure provides a method for fabricating a thin film transistor. The method for fabricating a thin film transistor includes: forming an active layer on a base substrate; forming a gate stack on the active layer. The gate stack comprises: a gate insulating layer on the active layer; a gate electrode on the gate insulating layer; a capping layer on the gate electrode, the capping layer being more easily to trap oxygen atoms than the gate electrode.

In one embodiment, the capping layer includes a gallium-containing oxide.

In one embodiment, gallium-containing oxide includes at least one of the following materials: IGZO, GZO, IGO, gallium oxide, or a combination thereof.

In one embodiment, forming the gate stack includes: forming an insulating material layer on the active layer; forming a conductive layer on the insulating material layer; forming a capping material layer on the conductive layer; and performing a patterning to form the gate stack.

A fifth aspect of the present disclosure provides a method for fabricating an array substrate. The method for fabricating the array substrate includes the method for fabricating a thin film transistor as described above.

In one embodiment, the fabricating method for the array substrate further includes forming a light shielding layer and a second wiring on the base substrate before forming the active layer; after forming the active layer, forming a first wiring on the base substrate; and performing a plasma treatment on the upper surface of the capping layer and the upper surface of the active layer, after forming the gate stack and before forming the dielectric layer. The second wiring and the light shielding layer are simultaneously formed. The light shielding layer can block light from below the active layer from entering the active layer. The first wiring is formed simultaneously with the gate stack, and the first wiring has the same structure as the gate stack.

In one embodiment, the fabricating method for the array substrate further comprises: after forming the light shielding layer and the second wiring and before forming the active layer, forming a buffer layer on the light shielding layer; after forming the gate stack and the first wiring, forming a dielectric layer on the capping layer and the first wiring; forming a first hole, a second hole and a third hole in the dielectric layer; forming a first contact, a second contact and a third contact on the dielectric layer; and forming a passivation layer on the first contact, the second contact, and the third contact. The buffer layer covers the upper surface of the light shielding layer, the upper surface of the second wiring, and the exposed upper surface of the substrate, wherein the dielectric layer covers an upper surface of the active layer and the an upper surface of the buffer layer not covered by the active layer. The first hole reaches the upper surface of the active layer. The second hole reaches the upper surface of the first wiring. The third hole reaches the upper surface of the second wiring, and wherein the third hole is formed by one etching. The first contact is connected to a source/drain region of a thin film transistor via the first hole. The second contact is connected to the first wiring via the second hole, and the third contact is connected to the second wiring via the third hole.

DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
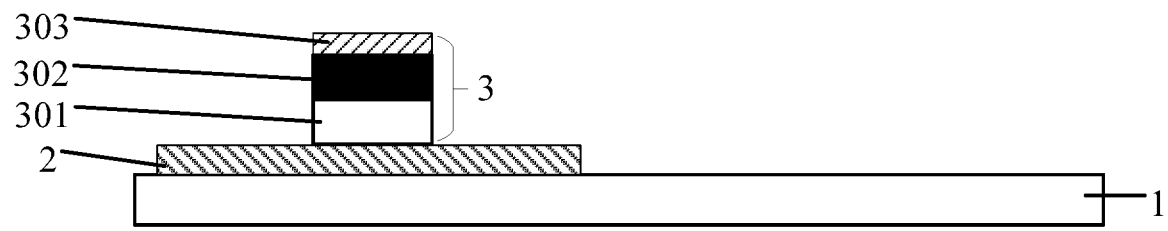
FIG. 1 is a schematic view of a thin film transistor according to a embodiment of the present disclosure.

In order to make the objectives, technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

One aspect of the present disclosure provides a thin film transistor. FIG. 1 is a schematic view of a thin film transistor according to an embodiment of the present disclosure. As shown in FIG. 1, a thin film transistor according to an embodiment of the present disclosure includes a base substrate 1, an active layer 2 disposed on the base substrate 1 and a gate stack 3 disposed on the active layer. As can also be seen from FIG. 1, the gate stack 3 includes: a gate insulating layer 301 disposed on the active layer 2, a gate electrode 302 disposed on the gate insulating layer 301 and a capping layer 30 disposed on the gate electrode 302. The capping layer 303 captures oxygen atoms more easily than the gate electrode 302. It can be understood that in the embodiment shown in FIG. 1, the gate insulating layer 301 defines a gate region and source/drain regions on both sides of the gate region.

Since in the embodiments of the present disclosure, the capping layer is more easily to trap oxygen atoms than the gate electrode, embodiments of the present disclosure can solve the problem of oxidation of the gate electrode under the capping layer. Here, "the capping layer is more easily to trap oxygen atoms than the gate electrode" means that the material of the capping layer is more easily to be bonded and fixed to oxygen atoms than the material of the gate electrode. Therefore, the problem of oxidation of the gate electrode under the overcoat layer can be solved.

In one embodiment, the capping layer 303 includes a gallium-containing oxide. Gallium-containing oxides have stronger oxygen atom trapping capability than common gate electrodes. Since Ga—O has large bond energy, Ga can better bind O. Therefore, the problem of oxidation of the gate electrode under the capping layer can be solved. For example, when the gate electrode includes copper, since the Ga of the Ga—O—Cu interface is bound by Ga, the problem of Cu oxidation can be solved.

In addition, since the capping layer and the gate electrode are often etched during the fabricating process, the gallium-containing oxide etch rate is slower than the gate electrode etch rate below it. Therefore, the thin film transistor of the embodiment of the present disclosure can also solve the side edge oxidation problem of the gate electrode.

In one embodiment, the gallium-containing oxide includes at least one of the following materials: IGZO (indium gallium zinc oxide), GZO (Ga-doped ZnO), IGO (Indium Gallium Oxide), gallium oxide, or combinations thereof. In one embodiment, for the case of gallium-containing oxide including indium gallium zinc oxide (IGZO), the atomic ratio of indium gallium and zinc may be set to In:Ga:Zn=2:2:1, or according to practical need, In:Ga:Zn=1:1:4.

In one embodiment, the gallium-containing oxide is oxygen deficient. Herein, "oxygen deficient" means that the oxygen content of the gallium-containing oxide is lower than that of the normal stoichiometric ratio.

In one embodiment, the material of the active layer and the material of the capping layer may be the same. In this way, fabricating costs can be saved.

Figure 2:
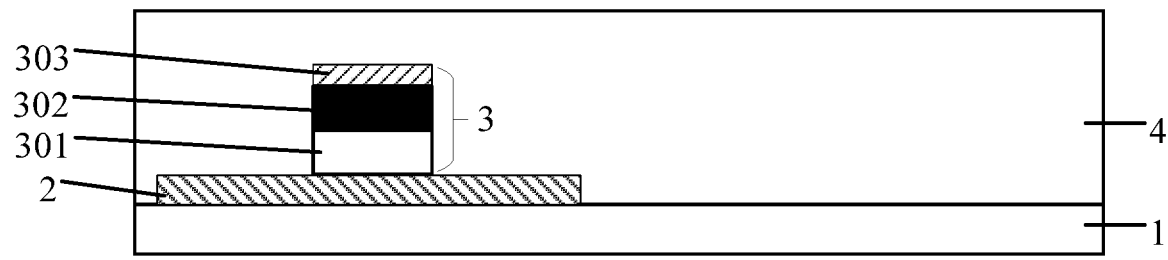
FIG. 2 is a schematic view of a thin film transistor according to an embodiment of the present disclosure.

FIG. 2 is a schematic view of a thin film transistor according to one embodiment of the present disclosure. As shown in FIG. 2, the thin film transistor according to one embodiment of the present disclosure may further include a dielectric layer 4 disposed on the capping layer 303. The dielectric layer 4 covers the exposed upper surface of the active layer 2 and the surface of the capping layer 303.

Figure 3:
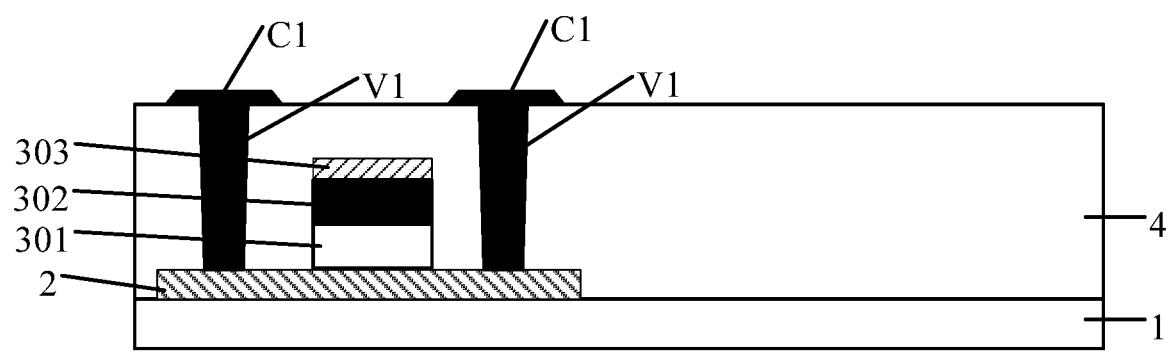
FIG. 3 is a schematic view of a thin film transistor according to an embodiment of the present disclosure.

FIG. 3 is a schematic view of a thin film transistor according to one embodiment of the present disclosure. As shown in FIG. 3, the thin film transistor according to one embodiment of the present disclosure may further include: a first contact portion C1 disposed on the dielectric layer 4 and a first hole V1 located in the dielectric layer 4, wherein the first contact portion C1 is connected to the source/drain regions of the thin film transistor via the first hole V1.

Figure 4:
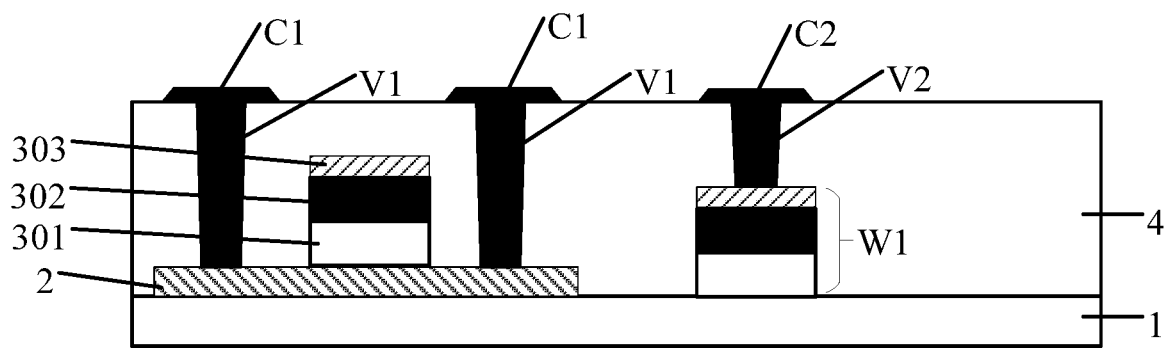
FIG. 4 is a schematic view of a thin film transistor according to an embodiment of the present disclosure.

FIG. 4 is a schematic view of an array substrate according to one embodiment of the present disclosure. As shown in FIG. 4, the array substrate according to an embodiment of the present disclosure may further include: a first wiring W1 located in the dielectric layer 4, a second contact portion C2 disposed on the dielectric layer 4, and a second hole in V2 in the dielectric layer 4. The first wiring W1 has the same structure as the gate stack 3, and the top surface of the first wiring W1 is higher than the top surface of the active layer 2. The second contact portion C2 is connected to the first wiring W1 via the second hole V2.

Figure 5:
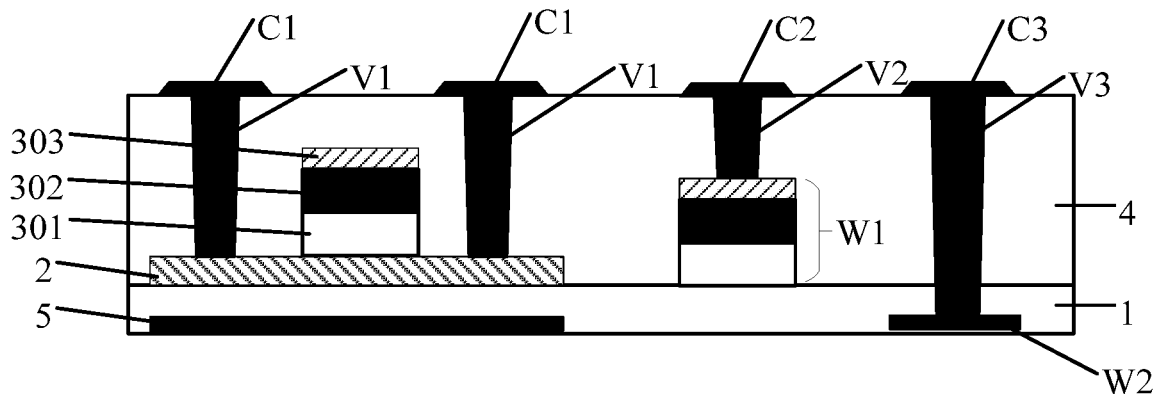
FIG. 5 is a schematic view of a thin film transistor according to an embodiment of the present disclosure.

FIG. 5 is a schematic view of an array substrate according to one embodiment of the present disclosure. As shown in FIG. 5, the array substrate according to one embodiment of the present disclosure may further include: a light shielding layer 5 disposed between the active layer 2 and the base substrate 1 to block light entering from below the active layer 2 entering the active layer 2; a second wiring W2, which is in the same layer as the light shielding layer 5; a third contact portion C3 disposed on the dielectric layer 4; a third hole V3 passing through the dielectric layer 4 and extending to the base substrate 1. The third contact portion C3 is connected to the second wiring W2 via the third hole V3. It is to be noted that the second wiring W2 in FIG. 5 is merely exemplary and does not limit the present disclosure.

Figure 6:
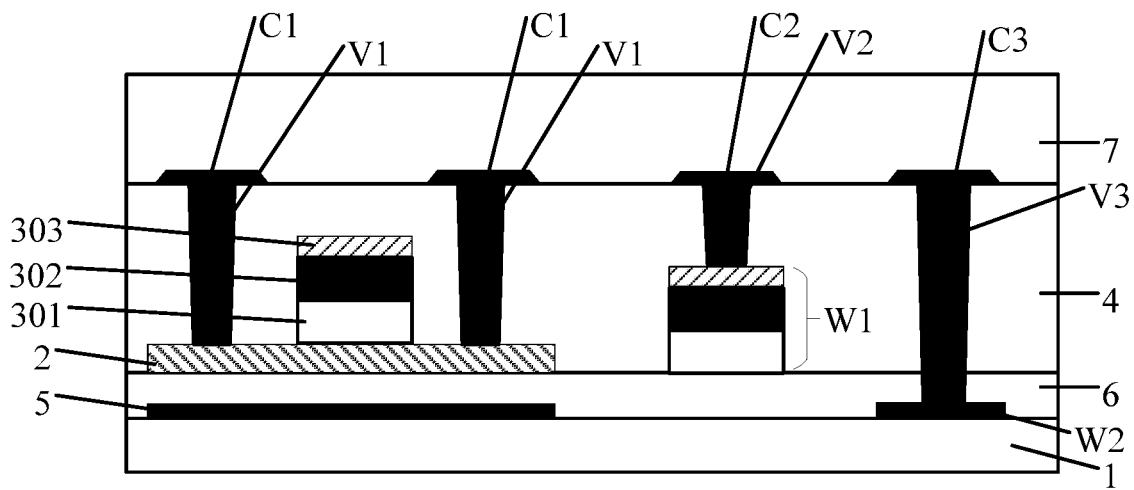
FIG. 6 is a schematic view of a thin film transistor according to an embodiment of the present disclosure.

FIG. 6 is a schematic view of an array substrate according to one embodiment of the present disclosure. As shown in FIG. 6, the thin film transistor according to one embodiment of the present disclosure may further include: a buffer layer 6 disposed between the active layer 2 and the base substrate 1 and a passivation layer 7 disposed on the first contact C1, the second contact C2 and the third contact portion C3. The buffer layer 6 covers the upper surface of the light shielding layer 5, the upper surface of the second wiring W2 and the exposed upper surface of the base substrate 1.

The material and thickness of each layer can be selected according to actual needs. The base substrate 1 may include glass. The light shielding layer 5 and the second wiring W2 may include metal, and its thickness may range from about 50 to 400 nm (e.g., 100 nm). The thickness of the buffer layer 6 may range from about 100 to 500 nm (e.g., about 300 nm). The thickness of the active layer 2 may range from about 10 to 100 nm (e.g., about 40 nm). The gate insulating layer 301 may include silicon oxide (SiOx), and the gate insulating layer may have a thickness of about 100 to 500 nm (e.g., about 150 nm). The gate electrode 302 may include copper and its thickness may range from about 50 to 1000 nm (e.g., about 420 nm). The dielectric layer 4 may also include silicon oxide (SiOx), which may have a thickness ranging from about 100 to 500 nm (e.g., about 300 nm). The passivation layer 7 may include at least one of silicon oxide (SiOx) and silicon nitride (SiNx), and its thickness may range from about 200 to 400 nm (e.g., about 300 nm). The first contact portion, the second contact portion and the third contact portion may be formed by a sputtering method. The first contact portion, the second contact portion and the third contact portion may have a thicknesses ranging from 50 to 400 nm.

Another aspect of the present disclosure provides a method for fabricating a thin film transistor. The following will describe in conjunction with different embodiments. It should be pointed out that the numbers of the steps of the method in the present document are only exemplary and do not represent the limitation of the sequence of steps.

Figure 7:
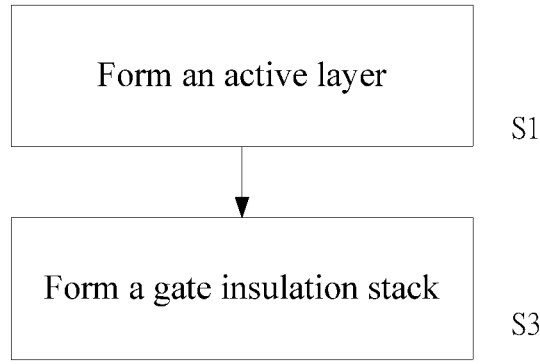
FIG. 7 is a schematic flowchart of a method for fabricating a thin film transistor according to an embodiment of the present disclosure.

FIG. 7 is a schematic flowchart of a method for fabricating a thin film transistor according to an embodiment of the present disclosure. As shown in FIG. 7, a method for fabricating a thin film transistor according to an embodiment of the present disclosure includes:

S1, forming an active layer on a base substrate;

S3, forming a gate stack on the active layer. The gate stack includes a gate insulating layer disposed on the active layer, a gate electrode disposed on the gate insulating layer, and a capping layer on the gate electrode. The capping layer is more easily to capture oxygen atoms than the gate electrode.

Since in the embodiments of the present disclosure, the capping layer traps oxygen atoms more easily than the gate electrode, embodiments of the present disclosure can solve the problem of oxidation of the gate electrode under the capping layer.

In an embodiment, the capping layer 303 includes a gallium-containing oxide. Gallium-containing oxides have stronger oxygen atom trapping capability than common gate electrode. Since Ga—O has a large bond energy, Ga can better bind O, so that the problem of oxidation of the gate electrode under the capping layer can be solved. For example, when the gate electrode includes copper, since the O of the Ga—O—Cu interface is bound by Ga, the problem of Cu oxidation can be solved.

In addition, since the capping layer and the gate electrode are often etched during the fabricating process, a etch rate of the gallium-containing oxide is slower than that of the gate electrode below it. Therefore, the thin film transistor of the embodiment of the present disclosure can also solve the side oxidation problem of the gate electrode.

In one embodiment, the gallium-containing oxide includes at least one of the following materials: IGZO (indium gallium zinc oxide), GZO (Ga-doped ZnO), IGO (Indium Gallium Oxide), gallium oxide or combinations thereof. In an embodiment, for the case of gallium-containing oxide including indium gallium zinc oxide (IGZO), the atomic ratio of indium gallium and zinc may be set to In:Ga:Zn=2:2:1, or according to practical need, In:Ga:Zn=1:1:4.

Figure 8:
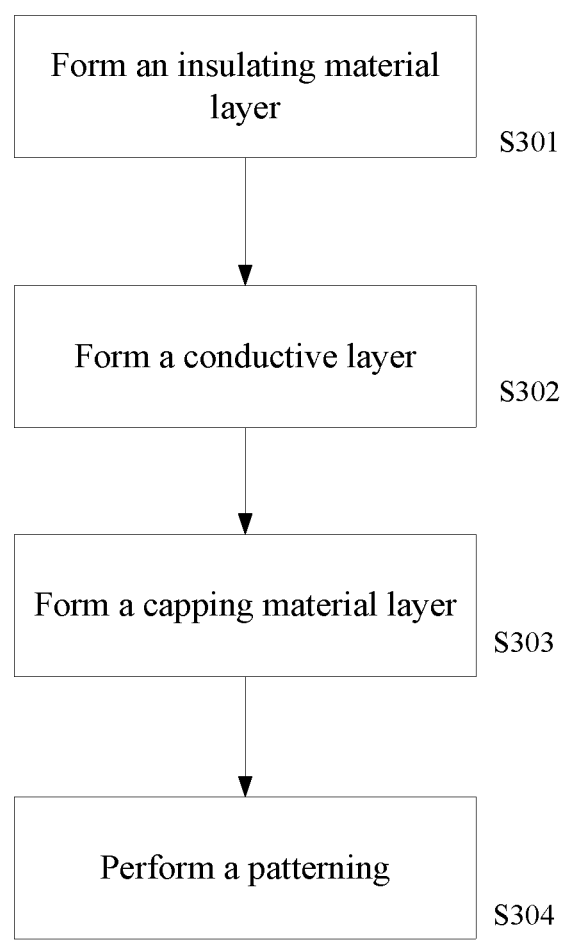
FIG. 8 is a schematic flowchart of a method for fabricating a gate stack according to an embodiment of the present disclosure.

FIG. 8 is a schematic flow view of a method for fabricating a gate stack according to one embodiment of the present disclosure. As shown in FIG. 8, a method for fabricating a gate stack according to an embodiment of the present disclosure includes:

S301, forming an insulating material layer on the active layer;

S302, forming a conductive layer on the insulating material layer;

S303, forming a capping material layer on the conductive layer;

S304, performing a patterning to form a gate stack.

In one embodiment, the method for fabricating a thin film transistor further includes plasma-treating the upper surface of the capping layer and the upper surface of the active layer after performing the patterning to form the gate stack. The problem of oxidation of the gate electrode can be further solved by plasma treatment, which will be described in detail below.

The present disclosure also provides a method for fabricating an array substrate, including the method for fabricating a thin film transistor as described above.

Figure 9:
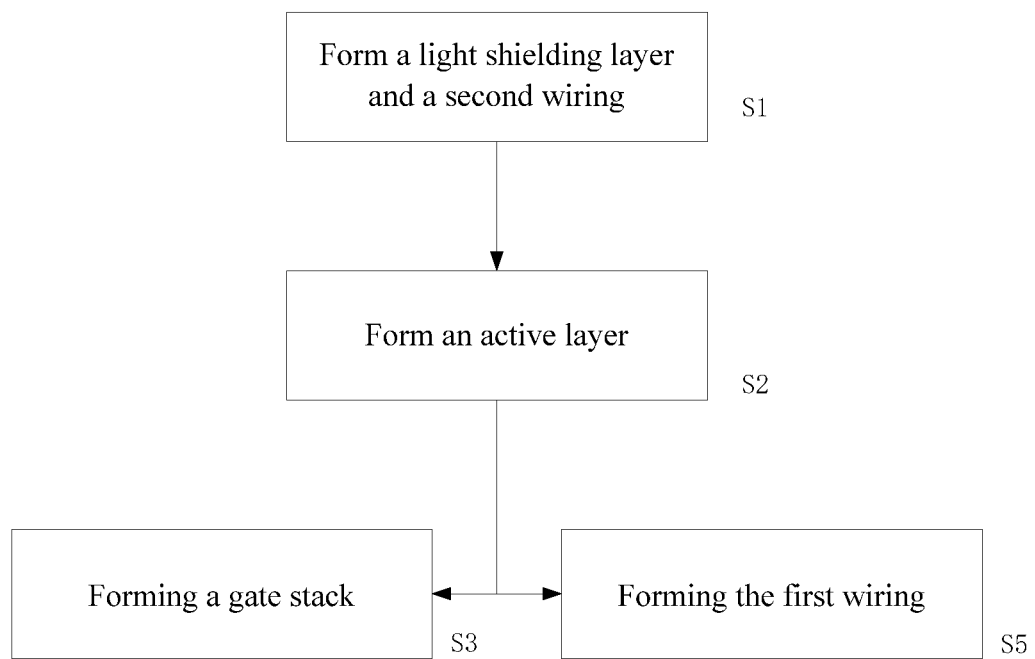
FIG. 9 is a schematic flowchart of a method for fabricating an array substrate according to an embodiment of the present disclosure.

FIG. 9 is a schematic flowchart of a method for fabricating an array substrate according to an embodiment of the present disclosure. As shown in FIG. 9, a fabricating method for an array substrate according to an embodiment of the present disclosure further includes:

S2: before forming the active layer, forming a light shielding layer and a second wiring on the base substrate. wherein the second wiring and the light shielding layer are simultaneously formed, and wherein the light shielding layer is capable to block the light from below the active lay from entering the active layer;

S5: after forming the active layer, forming a first wiring on the base substrate, wherein the first wiring and the gate stack are formed simultaneously, and wherein the first wiring has the same structure as the gate stack.

Figure 10:
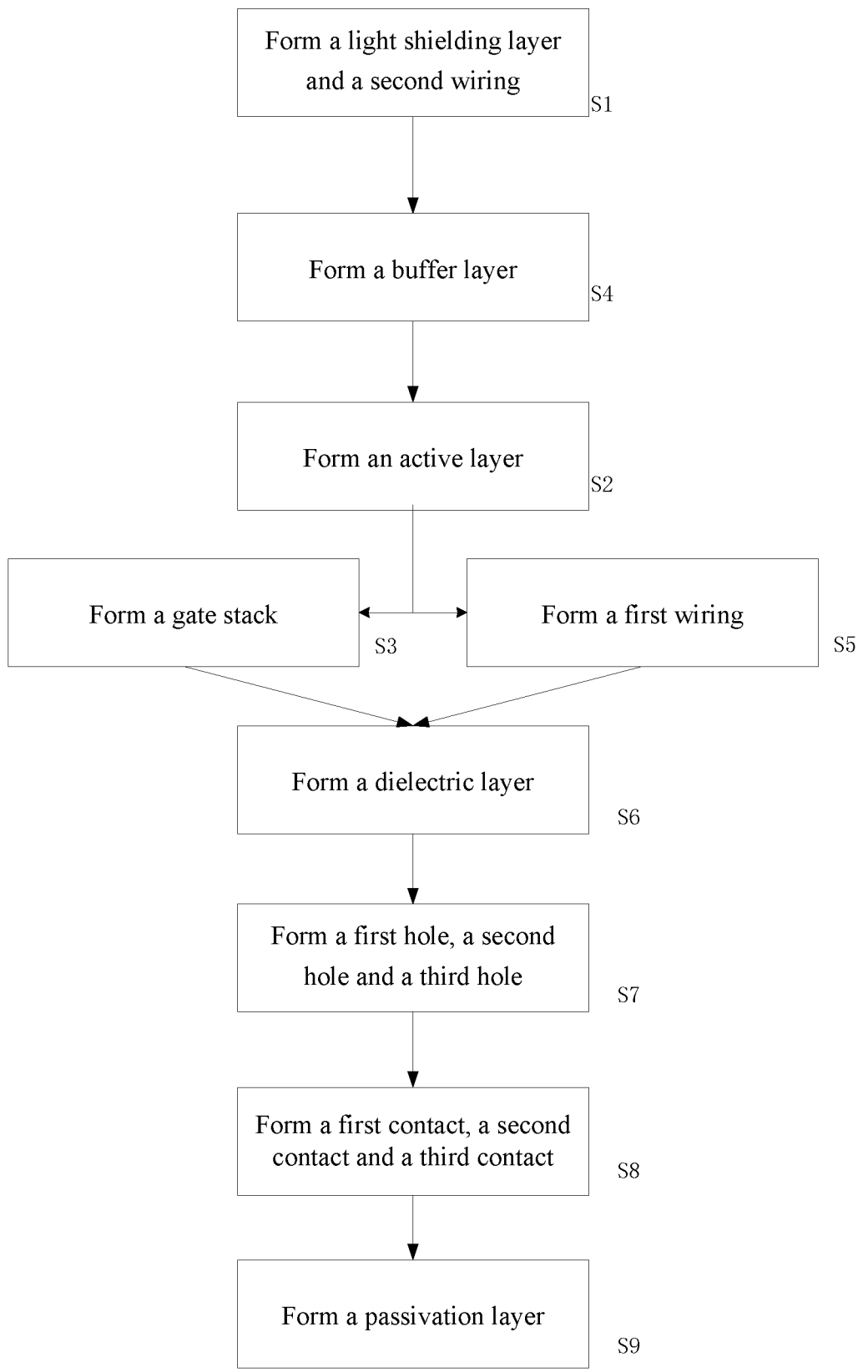
FIG. 10 is a schematic flowchart of a method for fabricating an array substrate according to an embodiment of the present disclosure.

FIG. 10 is a schematic flowchart of a method for fabricating an array substrate according to an embodiment of the present disclosure. As shown in FIG. 10, a method for fabricating a thin film transistor according to an embodiment of the present disclosure may further include:

S4: forming a buffer layer on the light shielding layer after forming the light shielding layer and the second wiring and before forming the active layer, wherein the buffer layer covers the upper surface of the light shielding layer, the upper surface of the second wiring and the exposed upper surface of the base substrate.

S6: after forming the gate stack and the first wiring, forming a dielectric layer on the capping layer and the first wiring, wherein the dielectric layer covers the upper surface of the active layer and the upper surface of the buffer layer not covered by the active layer;

S7: forming a first hole, a second hole and a third hole in the dielectric layer, wherein the first hole reaches an upper surface of the active layer; the second hole reaches an upper surface of the first wiring; and the third hole reaches the upper surface of the second wiring, and wherein the third hole is formed by one process;

S8: forming a first contact portion, a second contact portion, and a third contact portion on the dielectric layer, wherein the first contact portion is connected to the source/drain region via the first hole, the second contact portion is connected to the first wiring via the second hole, the third contact portion is connected to the second wiring via the third hole;

S9: forming a passivation layer on the first contact portion, the second contact portion and the third contact portion.

FIGS. 11(A)-11(K) are process flow views of a method for fabricating an array substrate according to an embodiment of the present disclosure. A method for fabricating a thin film transistor according to an embodiment of the present disclosure will be further described below with reference to FIG. 11.

As shown in FIG. 11(A), a fabricating method for an array substrate according to an embodiment of the present disclosure includes forming a light shielding layer 5 and a second wiring W2 on a substrate 1. The second wiring and the light shielding layer are formed at the same time. In one embodiment, the metal layer may be deposited by sputtering or evaporation, and then the metal layer may be patterned to form the light shielding layer and the second wiring. The thickness of the metal layer may range from about 50 to 400 nm (e.g., about 100 nm).

Further, as shown in FIG. 11(B), the method for fabricating an array substrate according to an embodiment of the present disclosure further includes: forming a buffer layer 6 on the light shielding layer and the second wiring. The buffer layer 6 covers the upper surface of the light shielding layer 5, the upper surface of the second wiring W2 and the exposed upper surface of the base substrate 1. In one embodiment, the buffer layer may be deposited using PECVD (Plasma Enhanced Chemical Vapor Deposition). The buffer layer may have a thickness in the range of about 100-500 nm (e.g., about 300 nm).

Further, as shown in FIG. 11(C), the method for fabricating an array substrate according to an embodiment of the present disclosure further includes forming an active layer 2 on the buffer layer 6. In one embodiment, a semiconductor layer may be deposited on the buffer layer using a sputtering method, and then the semiconductor layer may be patterned to form an active layer. The thickness of the active layer 2 may range from about 10 to 100 nm (e.g., about 40 nm).

Further, as shown in FIG. 11(D), the method for fabricating an array substrate according to an embodiment of the present disclosure further includes: forming an insulating material layer 301' on the active layer, wherein the insulating material layer 301' covers the upper surface of the active layer 2 and the exposed upper surface of the buffer layer 6; forming a conductive layer 302' on the insulating material layer 301'; forming a cover material layer 303' on the conductive layer 302'.

In one embodiment, PECVD may be used to form the insulating material layer 301'. The insulating material layer 301' may include silicon oxide (SiOx). The thickness of the insulating material layer 301' may range from about 100 to 500 nm (e.g., about 150 nm). In one embodiment, a sputtering method may be used to form the conductive layer 302' on the insulating material layer 301'. Conductive layer 302' may include copper, and its thickness may range from about 50 to 1000 nm (e.g., about 420 nm). The capping material layer 303' includes a gallium-containing oxide. In one embodiment, the gallium-containing oxide includes at least one of the following materials: IGZO (indium gallium zinc oxide), GZO (Ga-doped ZnO), IGO (Indium Gallium Oxide), gallium oxide or combinations thereof.

Further, as shown in FIG. 11(E), the method for fabricating an array substrate according to an embodiment of the present disclosure further includes: patterning the conductive layer 302' and the capping material layer 303' to form the gate electrode 302 and the capping layer 303. For example, wet etching may be used to pattern the conductive layer 302' and the capping material layer 303'. Since the capping material layer 303' includes a gallium-containing oxide whose etching rate is slower than that of the gate electrode below it, the problem of oxidation of the side edge including a gate electrode such as copper can be solved. If the conductive layer 302' includes a material such as copper, the etching solution for the conductive layer can also be etched including gallium oxide-containing etch, and therefore, no additional process burden is added.

Further, as shown in FIG. 11(F), the method for fabricating an array substrate according to an embodiment of the present disclosure further includes patterning an insulating material layer 301' to form a gate insulating layer 301. It can be seen that according to the method of fabricating the thin film transistor of the embodiment of the present disclosure, the gate stack 3 and the first wiring W1 can be simultaneously formed.

Further, as shown in FIG. 11(G), the method for fabricating an array substrate according to an embodiment of the present disclosure further includes performing a plasma treatment on an upper surface of the capping layer and an upper surface of the active layer. For example, plasma including at least one of the following materials may be applied: $NH_3$, He, Ar, $H_2$ and $N_2$. By applying a plasma treatment, the regions of the capping layer and the active layer that are not covered by the gate electrode can be deoxygenated and electrically-conducted. Oxygen deficiency is caused by the application of plasma, which leads to less diffusion of oxygen atoms, thereby further solving the problem of oxidation of the gate electrode.

Figure 11:
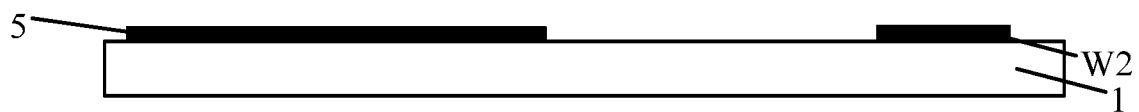
FIGS. 11(A)-11(K) are process flow views of a method of fabricating an array substrate according to an embodiment of the present disclosure.
Figure 11:
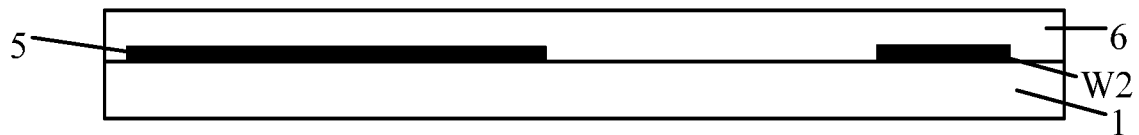
Figure 11:
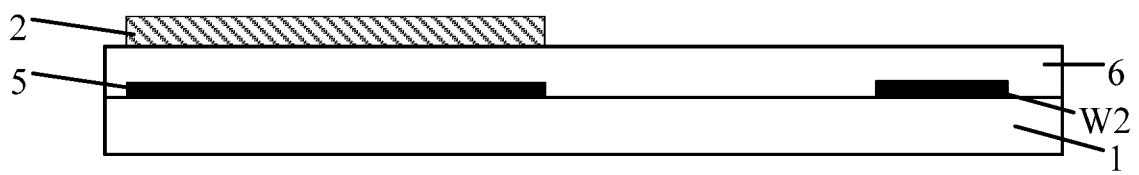
Figure 11:
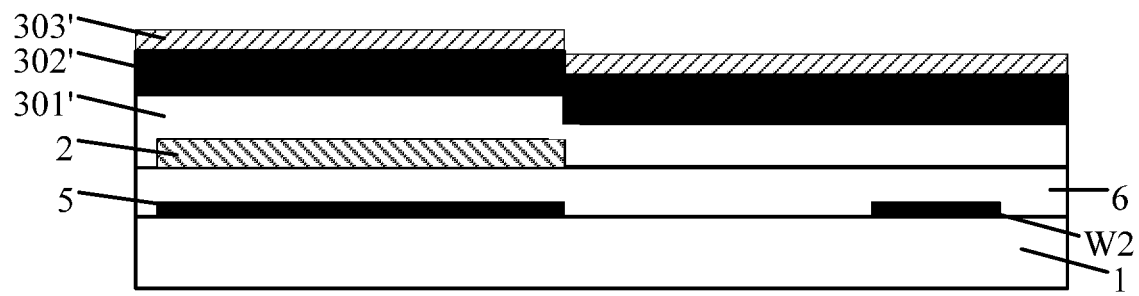
Figure 11:
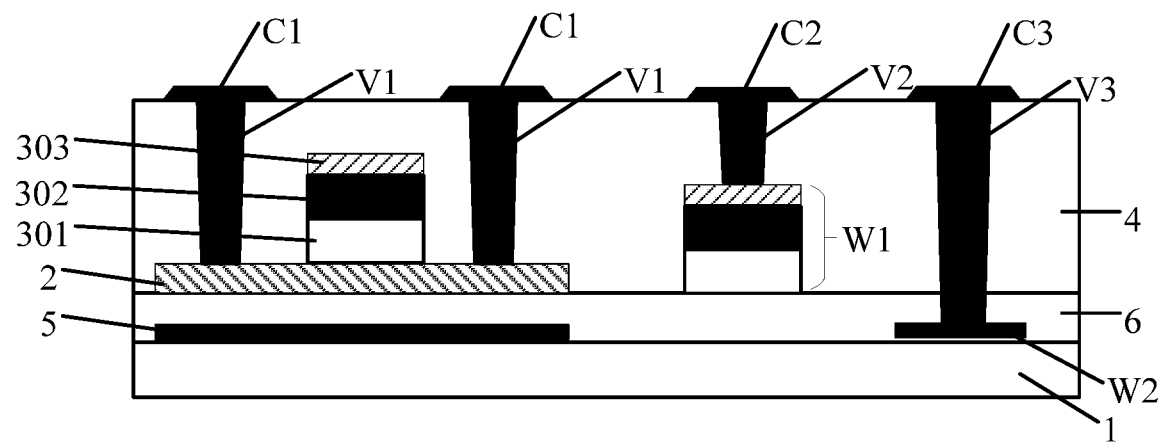
Figure 11:
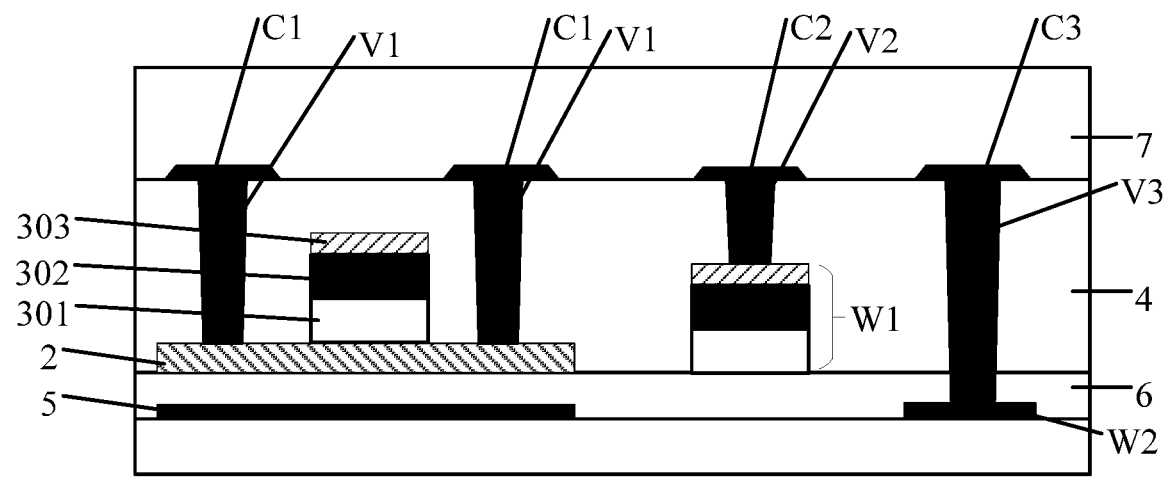

Further, as shown in FIG. 11 (H), the method for fabricating an array substrate according to an embodiment of the present disclosure further includes forming a dielectric layer 4 on the capping layer 303 and the first wiring W1. The dielectric layer 4 covers the upper surface of the active layer 2 and the upper surface of the buffer layer 6 that is not covered with the active layer 2. For example, PECVD may be used to form dielectric layer 4. The dielectric layer 4 may also include silicon oxide (SiOx), which may have a thickness ranging from about 100 to 500 nm (e.g., about 300 nm). The use of a material such as a gallium oxide-containing material as a capping layer can withstand higher temperatures, so that deposition of the dielectric layer can be performed at a higher temperature and device stability can be ensured.

Further, as shown in FIG. 11(I), the method for fabricating an array substrate according to an embodiment of the present disclosure further includes: forming a first hole V1, a second hole V2 and a third hole V3 in the dielectric layer 4. The first hole V1 reaches the upper surface of the active layer 2. The second hole V2 reaches the upper surface of the first wiring W1. The third hole V3 reaches the upper surface of the second wiring W2. The third hole V3 is formed by one etching process.

In the prior art, since the depth of the third hole V3 is deeper than the depth of the first hole V1, in order to avoid overetching the first hole V1 and damaging the structure under the first hole, two etchings are needed to form the third hole. In the embodiments of the present disclosure, the material of the capping layer is more resistant to etching and the etching speed is slower. Therefore, the third hole can be formed by etching only once, without damaging the gate electrode under the capping layer caused by the etching. Compared to the conventional Mo-based metal material, the capping layer of the embodiments of the present disclosure employs a material such as a gallium oxide-containing material with better adhesion to the photoresist, so that a better etching effect can be achieved.

Further, as shown in FIG. 11(J), the method for fabricating an array substrate according to an embodiment of the present disclosure further includes forming a first contact C1, a second contact C2 and a third contact C3 on the dielectric layer 4. The first contact portion C1 is connected to the source/drain region via the first hole C1. The second contact portion C2 is connected to the first wiring W1 via the second hole V2. The third contact portion C3 is connected to the second wiring W2 via the third hole V3. By sputtering metal to fill the first hole V1, the second hole V2 and the third hole V3 and cover the dielectric layer 4, and then performing a patterning, the first contact C1, the second contact C2, and the third contact C3 are formed. The first contact portion, the second contact portion and the third contact portion may have a thickness ranging from 50 to 400 nm.

Further, as shown in FIG. 11 (K), the method for fabricating a thin-array substrate according to an embodiment of the present disclosure further includes: forming a passivation layer on the first contact portion C1, the second contact portion C2, and the third contact portion C3. As can be seen, the passivation layer 7 also covers the exposed surface of the dielectric layer 4. For example, passivation layer 7 may be deposited using PECVD. The passivation layer 7 may include at least one of silicon oxide (SiOx) and silicon nitride (SiNx), and its thickness may range from about 200 to 400 nm (e.g., about 300 nm).

Figure 12:
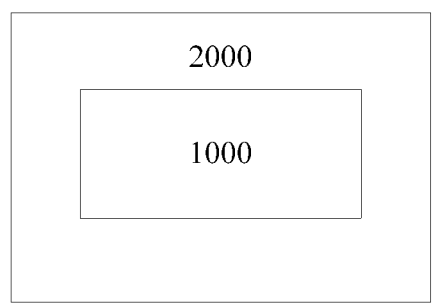
FIG. 12 is a schematic view of a display device according to an embodiment of the present disclosure.

The embodiments of the present disclosure also provide a method for fabricating a display device. FIG. 12 is a schematic view of a display device according to an embodiment of the present disclosure. As shown in FIG. 12, the display device 2000 in the embodiment of the present disclosure includes the array substrate 1000 as described above referring to FIGS. 1-6. The display device in the embodiments of the present disclosure may be any product or component having a display function such as a mobile phone, a tablet computer, a television, a notebook computer, a digital photo frame, a navigator, and the like.

Having described certain specific embodiments, these embodiments have been presented by way of example only, and are not intended to limit the scope of the present disclosure. Indeed, the novel embodiments described herein may be embodied in various other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A thin film transistor comprising an active layer disposed on a base substrate and a gate stack disposed on the active layer, wherein the gate stack comprises:
   a gate insulating layer disposed on the active layer;
   a gate electrode disposed on the gate insulating layer;
   a capping layer disposed on the gate electrode and being more easily to trap oxygen atoms than the gate electrode, wherein the capping layer comprises a gallium-containing oxide, and wherein the gallium-containing oxide is oxygen deficient.

2. The thin film transistor according to claim 1, wherein the gallium-containing oxide comprises at least one of the following materials: IGZO, GZO, IGO, gallium oxide, or a combination thereof.

3. The thin film transistor according to claim 1, wherein a material of the capping layer and a material of the active layer are the same.

4. The thin film transistor according to claim 1, wherein the thin film transistor further comprises a dielectric layer disposed on the capping layer, wherein the dielectric layer covers an upper surface of the active layer.

5. The thin film transistor according to claim 4, wherein the thin film transistor further comprises a first contact portion disposed on the dielectric layer and a first hole in the dielectric layer, wherein the first contact portion is connected to the source/drain region of the thin film transistor via the first hole.

6. An array substrate comprising the thin film transistor according to claim 1.

7. The array substrate according to claim 6, wherein the array substrate further comprises:
a first wiring in a dielectric layer, the first wiring having the same structure as the gate stack, a top surface of the first wiring being higher than a top surface of the active layer;
a second contact portion on the dielectric layer;
a second hole in the dielectric layer,
wherein the second contact portion is connected to the first wiring via the second hole.

8. The array substrate according to claim 7, wherein the array substrate further comprises:
a light shielding layer disposed between the active layer and the base substrate to block light from below the active layer from entering the active layer;
a second wiring being in the same layer as the light shielding layer;
a third contact portion on the dielectric layer;
a third hole passing through the dielectric layer and extending into the base substrate,
wherein the third contact portion is connected to the second wiring through the third hole.

9. The array substrate according to claim 8, wherein the array substrate further comprises:
a buffer layer disposed between the active layer and the base substrate, wherein the buffer layer covers an upper surface of the light shielding layer, an upper surface of the second wiring and an upper surface of the base substrate;
a passivation layer on a first contact portion, the second contact portion and the third contact portion.

10. A display device comprising the array substrate according to claim 8.

11. A display device comprising the array substrate according to claim 9.

12. A display device comprising the array substrate according to claim 7.

13. A display device comprising the array substrate according to claim 6.

14. A method for fabricating a thin film transistor, comprising:
forming an active layer on a base substrate;
forming a gate stack on the active layer,
wherein, the gate stack comprises:
a gate insulating layer on the active layer;
a gate electrode on the gate insulating layer;
a capping layer on the gate electrode, the capping layer being more easily to trap oxygen atoms than the gate electrode, wherein the capping layer comprises a gallium-containing oxide, and wherein the gallium-containing oxide is oxygen deficient.

15. The method for fabricating a thin film transistor according to claim 14, wherein the gallium-containing oxide comprises at least one of the following materials: IGZO, GZO, IGO, gallium oxide, or a combination thereof, and forming the gate stack comprises:
forming an insulating material layer on the active layer;
forming a conductive layer on the insulating material layer;
forming a capping material layer on the conductive layer;
performing a patterning to form the gate stack.

16. A method for fabricating an array substrate, comprising the method for fabricating a thin film transistor according to claim 14.

17. The method for fabricating an array substrate according to claim 16, further comprising:
before forming the active layer, forming a light shielding layer and a second wiring on the base substrate, wherein the second wiring and the light shielding layer are simultaneously formed, and wherein the light shielding layer is capable to block the light from below the active layer from entering the active layer;
after forming the active layer, forming a first wiring on the base substrate, wherein the first wiring and the gate stack are formed simultaneously, and wherein the first wiring has the same structure as the gate stack;
after forming the gate stack and before forming dielectric layer, performing a plasma treatment on an upper surface of the capping layer and an upper surface of the active layer.

* * * * *